United States Patent
Rozeau et al.

(10) Patent No.: US 10,290,667 B2
(45) Date of Patent: May 14, 2019

(54) FRONT-ILLUMINATED PHOTOSENSITIVE LOGIC CELL

(71) Applicant: Commissariat a L'Energie Atomique et aux Energies Alternatives, Paris (FR)

(72) Inventors: Olivier Rozeau, Moirans (FR); Laurent Grenouillet, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 103 days.

(21) Appl. No.: 15/335,123

(22) Filed: Oct. 26, 2016

(65) Prior Publication Data

US 2017/0125458 A1 May 4, 2017

(30) Foreign Application Priority Data

Oct. 28, 2015 (FR) ..................... 15 60288

(51) Int. Cl.
*H01L 27/144* (2006.01)
*G02F 3/02* (2006.01)

(52) U.S. Cl.
CPC .......... *H01L 27/1446* (2013.01); *G02F 3/022* (2013.01)

(58) Field of Classification Search
CPC ............. H01L 27/1446; H01L 31/0547; H01L 25/047; H01L 25/167; H01L 27/142; H01L 27/1461; H01L 27/14643; H01L 27/3269; H01L 31/125; H01L 27/14607; G02F 3/022
See application file for complete search history.

(56) References Cited

U.S. PATENT DOCUMENTS

| 8,890,219 B2 | 11/2014 | Grenouillet et al. |
| 2004/0201047 A1 | 10/2004 | Takamura |
| 2006/0125038 A1 | 6/2006 | Mabuchi |
| 2008/0237761 A1* | 10/2008 | Fu ............... H01L 27/14603 257/432 |
| 2010/0127153 A1* | 5/2010 | Agarwal ......... H01L 27/1446 250/200 |

(Continued)

FOREIGN PATENT DOCUMENTS

| EP | 2 587 539 A1 | 5/2013 |
| EP | 2 947 689 A2 | 11/2015 |

OTHER PUBLICATIONS

French Preliminary Search Report dated Jul. 22, 2016 in French Application 15 60288 filed on Oct. 28, 2015 (with English Translation of Categories of Cited Documents).

(Continued)

*Primary Examiner* — Shahed Ahmed
(74) *Attorney, Agent, or Firm* — Oblon, McClelland, Maier & Neustadt, L.L.P.

(57) ABSTRACT

Photosensitive logic cell on a semiconductor-on-insulator substrate, possessing a P type transistor and an N type transistor fabricated on the front face of the substrate and whose respective threshold voltages can be modulated according to the quantity of photons received by a photosensitive zone provided opposite these transistors, the photosensitive zone possessing a photo-detection region whose arrangement is such that it favours illumination by the face of the photosensitive zone.

10 Claims, 9 Drawing Sheets

(56) References Cited

U.S. PATENT DOCUMENTS

2013/0260505 A1* 10/2013 Bedell .................. H01L 27/142
 438/67
2014/0339614 A1* 11/2014 Fang .................. H01L 27/1461
 257/292

OTHER PUBLICATIONS

R. Tsuchiya, et al., "Silicon on Thin BOX: A New Paradigm of the CMOSFET for Low-Power and High-Performance Application Featuring Wide-Range Back-Bias Control", IEEE, IED Technical Digest, 2004, 4 pgs.
U.S. Appl. No. 14/719,580, filed May 22, 2015, 2015/0338720 A1, Laurent Grenouillet, et al.

* cited by examiner

Fig. 6B

FRONT-ILLUMINATED PHOTOSENSITIVE LOGIC CELL

TECHNICAL FIELD AND PRIOR ART

This invention relates to the field of photosensitive devices and relates to the implementation of a photosensitive logic cell also referred to as a photonic logic inverter, with front face illumination.

In the technical field of photosensitive devices, document EP 2°587°539 describes a microelectronic device formed from a transistor fabricated on the front face of a substrate of the semiconductor-on-insulator type, the transistor having a threshold voltage that can be modulated according to a quantity of photons received by a photosensitive zone located in the semiconductor support layer of the substrate, and separated from the channel zone of the transistor by means of the insulating layer of the substrate. Variation of the threshold voltage is allowed thanks to capacitive coupling established between the photosensitive zone and the channel zone of the transistor. Thus, when there is no light radiation to be detected, the threshold voltage of the transistor is equal to a value $Vt_1$, whilst when there is light radiation to be detected, the threshold voltage of the transistor is equal to a value $Vt_2$ which differs from $Vt_1$. Using such a device, it is sought to implement a binary detection method for light radiation.

Illumination of the device is primarily achieved by the rear face, that is, the face away from the front face upon which the transistor is made.

In order to improve collection of photons by the photosensitive zone it is generally sought to reduce the thickness of the support layer, which may make the substrate fragile.

The problem arises of making a new photosensitive device which can perform detection of light radiation and which can translate this detection into a digital signal form, and which is furthermore improved as regards the above stated drawbacks.

DESCRIPTION OF THE INVENTION

This invention relates to a photosensitive logic cell, the cell being equipped with a first transistor of the P type and with a second transistor of the N type, the first and second transistor resting on a semiconductor-on-insulator substrate, with the substrate comprising a surface semiconductor layer wherein a channel zone of the first transistor and a channel zone of said second transistor are formed, with an insulating later separating the surface semiconductor layer from a semiconductor support layer, this support layer comprising at least one photosensitive zone configured to convert photons into charge carriers, with the insulating layer being configured so as to allow electrostatic coupling between the photosensitive zone and the thin semiconductor layer, in such a way that the first transistor and the second transistor respectively have a first threshold voltage and a second threshold voltage that can be modulated according to a quantity of photons received by the photosensitive zone, with the photosensitive zone being formed of a N doped zone and a superposed P doped zone, with the photosensitive zone furthermore comprising a photo-detection region through which a luminous flux can enter.

According to one embodiment, the surface semiconductor layer of the substrate comprises an opening such that the semiconductor layer does not extend opposite the photo-detection layer.

Thus the cell is configured opposite the photo-detection region of the photosensitive zone in such a way as to favour the absorption of photons through the front face, that is, the face on which the transistors are arranged.

Advantageously a means of electrical insulation to insulate the cell from at least one other juxtaposed element is provided and comprises an additional gate electrode arranged at the periphery of the cell.

This additional gate extends around a region of the cell in which a first gate and a second gate electrode are arranged.

Such a means of insulation is of small dimensions, which may in return and if necessary allow a photo-detection region of large size to be provided, and thus a cell with improved sensitivity to be obtained.

The additional gate also allows an electrical insulation to be created without having to form an insulating zone between said cell and another juxtaposed element, for example another cell or circuit.

With such an insulation, the support layer and surface layer remain intact, thus avoiding the creation of defects in these layers and therefore limiting leakage currents.

The additional gate electrode can form a closed outline around the gates of the first and of the second transistor.

According to one embodiment possibility the first and second transistors respectively comprise a first gate and a second gate arranged opposite another region of the photosensitive region, with this region being located at the periphery of the photo-detection region.

Advantageously, the insulating layer extends opposite the opening of the photo-detection region. The insulating layer allows surface recombination effects to be limited. This allows the sensitivity of the cell to be improved.

The cell may advantageously be given a charge evacuation transistor connected to the photosensitive zone. This may allow faster discharge of the photosensitive zone and allow the time interval between two read cycles of a logic state of the cell to be reduced.

Such a charge evacuation transistor may be provided in order to allow, depending on its biasing state, a region of the photosensitive zone located beneath the insulating layer to be discharged.

According to one possibility of implementation, this charge evacuation transistor and the photosensitive zone are connected by means of at least one connection element in contact with the photo-detection region and which passes into said opening.

A biasing control circuit configured to apply a signal to the charge evacuation is then envisaged. The state of this signal is modified depending on the operational state in which it is wished to place the cell.

This signal emitted by the control circuit may be applied to the charge evacuation transistor gate in such a way as to block the charge evacuation transistor when reading of a logic state at the cell output is carried out, and in such a way as to make the charge evacuation transistor pass-through when erasure of the logic state at the output of the cell is performed.

The first transistor and the second transistor may be arranged in such a way as to have their gates connected together and their drains connected together.

The photosensitive logic cell may be arranged in such a way as to form a photosensitive logic inverter.

Advantageously the transistors in the cell are made using a "Fully Depleted Silicon on Insulator" or FDSOI technology.

The photosensitive logic cell may be integrated in a matrix device equipped with a matrix of photosensitive logic cells.

BRIEF DESCRIPTION OF THE ILLUSTRATIONS

The present invention will be better understood on reading the description of example embodiments, given purely as an indication and in no sense restrictively, making reference to the appended illustrations in which.

Identical, similar or equivalent portions of the various figures have the same numerical references, to make it easier to pass from one figure to another.

In order to make the figures more readable, the various parts shown in the figures are not necessarily shown at a uniform scale.

DETAILED DESCRIPTION OF PARTICULAR EMBODIMENTS

Figure 1A:
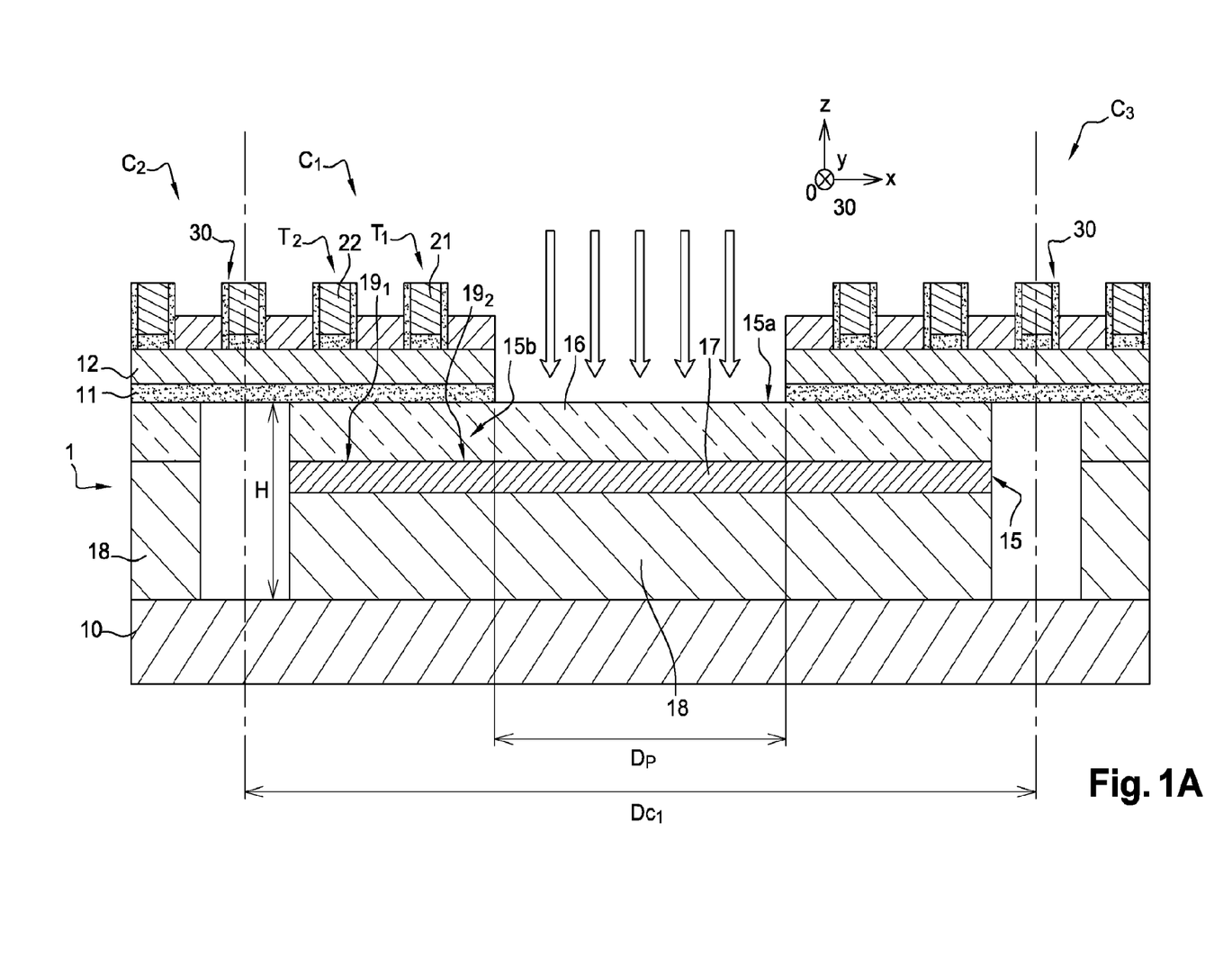
FIG. 1A serves to illustrate an example of a photosensitive logic cell implemented on a semiconductor-on-insulator type substrate and which comprises a first transistor and a second transistor of different types arranged on the front face of the substrate opposite a photosensitive zone, where this photosensitive zone comprises a photo-detection region opposite which the surface semiconductor layer of the substrate does not extend, in order to favour absorption of photons by the front face.

An example of a structure of a photosensitive cell $C_1$ with front face illumination is shown in FIG. 1A. This cell $C_1$ may be integrated in a matrix device comprising a plurality of cells of similar structures $C_2$, $C_3$.

The cell $C_1$ is formed of a first transistor $T_1$ of a first type, for example of P type, together with a second transistor $T_2$ of a second type, for example of N type, which are juxtaposed and formed on a semiconductor-on-insulator substrate 1, for example of the "silicon on insulator" (or SOI) type.

The substrate 1 comprises a semiconductor support layer 10, an insulating layer 11 resting on the support layer 10 and a surface semiconductor layer 12 arranged on the insulating layer 11 and wherein the channel of the first transistor $T_1$ and of the second transistor $T_2$ are provided. The transistors $T_1$ and $T_2$ may be MOS transistors (MOS for "Metal Oxide Semi-conductor") made for example in accordance with a technology of thin fully depleted buried oxide SOI type, known as UTBB-FDSOI ("Ultra-Thin Body and Box"-"Fully Depleted Silicon On Insulator"). The first transistor $T_1$ and the second transistor $T_2$ respectively comprise a first gate block 21 and a second gate block 22, where the source and drain regions of the transistors $T_1$, $T_2$ may extend in semiconductor regions formed on either side of the blocks 21, 22 on the surface semiconductor layer 12.

The cell $C_1$ possesses a photosensitive zone 15 which extends in the layer 10. The photosensitive zone 15 comprises a region 15a known as a "photo-detection" region together with another region 15b arranged opposite the first transistor $T_1$ and the second transistor $T_2$.

The substrate 1 is here configured to allow the collection of photons by its front face to be favoured. The term "front face" means the face on which the transistors $T_1$ and $T_2$ are arranged. More specifically, the surface semiconductor layer 12 is arranged in such a way that it does not extend opposite the photo-detection region 15a.

This discontinuity in the surface layer 12 of the substrate means that a light ray entering the photo-detection region 15a orthogonally in relation to a principal plane of the substrate does not pass through the surface layer 12. The term "principal plane" refers to a plane of the substrate parallel to the plane [0; x; y] of the orthogonal reference [0; x; y; z] in FIG. 1A. The photo-detection region 15a may have a critical dimension Dp of between for example 10 μm and 100 nm for a cell $C_1$ of critical dimension Dc1 of between for example 10.4 μm and 500 nm, typically 1 μm. The term critical dimension means the smallest dimension of a zone except for its thickness and measured parallel to the plane [0; x; y].

The cell $C_1$ is configured in such a way that a voltage that is photo-generated on the side of the photosensitive zone 15 can induce a corresponding voltage by electrostatic coupling on the surface semiconductor layer 12 side.

In order to do this the photosensitive zone 15 and the channel zone of the first transistor $T_1$ are separated by means of the insulating layer 11, whose configuration, in particular its composition and its thickness $e_2$, are envisaged in such a way as to allow electrostatic coupling to be established between a region 15b of the photosensitive zone 15 and the respective channel zones of transistors $T_1$, $T_2$. To allow electrostatic coupling between the support layer 10 and the surface semiconductor layer 12, an insulating layer 11 of low thickness is preferably envisaged. The insulating layer 11 may be based for example on $SiO_2$ and have a thickness $e_2$ which may be between for example 5 nm and 50 nm, preferably between 10 and 25 nm.

In the particular example in FIG. 1A, the photosensitive zone 15 is formed of a stack between a zone 18 doped according to a P type doping and a zone 16 doped according to an N type doping. Thus a first junction $19_1$ of type NP is arranged opposite the first transistor $T_{1,\ with}$ a second junction $19_2$ of type NP opposite the second transistor $T_2$. The junctions $19_1$, $19_2$ are in this example made in an overall P doped substrate layer. The space charge zone (SCZ) 19 between the N doped zone 16 and the P doped zone 18 is also shown in FIG. 1A. Typically, the height H (dimension measured parallel to the z axis of the orthogonal reference [0; x; y; z] given in FIG. 1A) of the photosensitive zone 15 may be between for example 100 nm and 5 μm.

In this configuration example with an upper N doped zone 16 and a lower P doped zone 18, the support layer 10 may be P doped in order to place an electrical insulation between the cells.

In order to electrically insulate the cell $C_1$ and an element outside this cell $C_1$ also created on the substrate, for example another photosensitive cell $C_2$, $C_3$ a transistor gate electrode 30 is provided. This gate electrode 30 is formed on the periphery of the cell $C_1$ and is configured so that, when it is biased in a suitable manner, it allows the cell $C_1$ to be electrically insulated from its neighbour $C_2$ or $C_3$.

Thus an insulation is made here between neighbouring cells without using an insulating trench structure, in particular of the "Shallow Trench Isolation" (STI) type. This allows space to be saved which may be expressed as the ability create a photo-detection zone which is more extensive in size, which eventually leads to an improvement in the sensitivity of the cell $C_1$.

The etching of trenches to form STI structures can result in the creation of defects. Also, the implementation of an insulation by means of the gate electrode 30 also allows leak currents to be reduced and increases the speed of operation of the cell $C_1$.

The gate electrode 30 is formed opposite a region of the support layer which is arranged at the periphery of the photosensitive zone 15 and does not comprise a junction or photosensitive region. In this example the region of the support layer 10 opposite which the gate electrode 30 is located is a P doped region.

A transistor possessing the gate 30 is biased in such a way as to block the passage of current around the cell $C_1$. The biasing potential applied to the gate 30 depends on the type of transistor, N or P, which is juxtaposed with it. In the embodiment example in FIG. 1A, the additional transistor is juxtaposed with the N type transistor $T_2$ and with a drain region connected to the drain region of the second transistor $T_2$. A potential of 0V may for example be applied to the additional gate 30 in order to allow the additional transistor to be placed in the blocked state in order that it fulfils its electrical insulation function. In another case (not shown), for example where the additional transistor is juxtaposed with the P type transistor $T_2$, a potential Vdd may be applied to the gate 30 in order to insulate cell $C_1$ from its neighbouring cell(s).

The insulation gate 30 may have a width (dimension measured parallel to the vector x in FIG. 1A) between for example 30 nm and 100 nm, whilst the width of the gates 22, 21 of the transistors $T_2$, $T_1$, may be for example between 20 nm and 60 nm. This dimension depends on the technological node used.

Advantageously the gate electrode 30 is formed from the same material or the same layer or the same stack as the respective gate electrodes 21, 22 of the first transistor $T_1$, and the second transistor $T_2$.

The photosensitive cell $C_1$ of FIG. 1A may be configured in such a manner as to form a photosensitive logic inverter, in particular of the CMOS type.

Figure 1B:
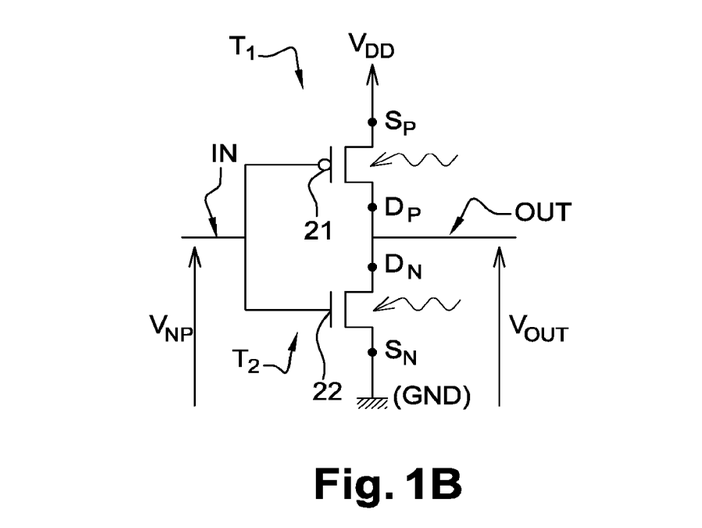
FIG. 1B shows a first configuration example of a photosensitive logic inverter formed from the cell in FIG. 1A, where the logic state of the inverter output is dependent on a quantity of photons received by the latter.

A first example of the CMOS photosensitive logic inverter formed from the cell in FIG. 1A is given in FIG. 1B.

The logic state of a signal $V_{OUT}$ emitted at the output OUT of this inverter depends on the quantity of photons received by the photosensitive zone 15 opposite the first transistor $T_1$ and the second transistor $T_2$.

The logic inverter comprises an IN terminal connected to the respective gates 21 and 22 of the first transistor $T_1$ and of the second transistor $T_2$, whilst the gates 21 and 22 are connected together.

A biasing circuit is provided to apply a suitable biasing potential VIN=$V_{NP}$ to a terminal IN of the inverter. In this configuration example it is a fixed potential chosen from a predetermined voltage range.

An output OUT from the inverter which allows the logic or binary signal $V_{OUT}$ to be delivered is connected to the respective drains $D_P$ and $D_N$ of the first transistor $T_1$ and of the second transistor $T_2$, where the drains $D_P$ and $D_N$ are connected to each other.

The device also comprises a means for biasing of the source of the first transistor $T_1$ intended to apply a potential $V_{DD}$ to the source $S_P$. The source $S_N$ of the second transistor $T_2$ may be set at a reference or GND potential $V_{SS}$ acting as a ground.

Thus transistors $T_1$ and $T_2$ are, in this example, biased in such a manner as to have a constant gate-source potential $V_{GS}$, where the change of state of pass-through or blocked conduction state of the transistors is achieved by a shift in their respective threshold voltages $V_{TN}$, $V_{TP}$ due to a variation in the illumination of the photosensitive zone.

The amplitude of the threshold voltage shift LIVS induced by the light (referred to as $LIVS_N$ for the N type transistor and $LIVS_P$ for the P type transistor) depends, for each transistor, on a capacitance ratio called the "Body Factor" between its channel and a region of the photosensitive zone which fulfils the role of a rear gate. The body factor (BF) depends on the biasing potential applied to the lower doped zone 18.

The sign of the voltage Vpol1, Vpol2 applied to control the threshold voltage shift LIVS depends on the direction of the junction (P/N or N/P), beneath the BOX insulating layer whereon the transistor channels rest.

Figure 1C:
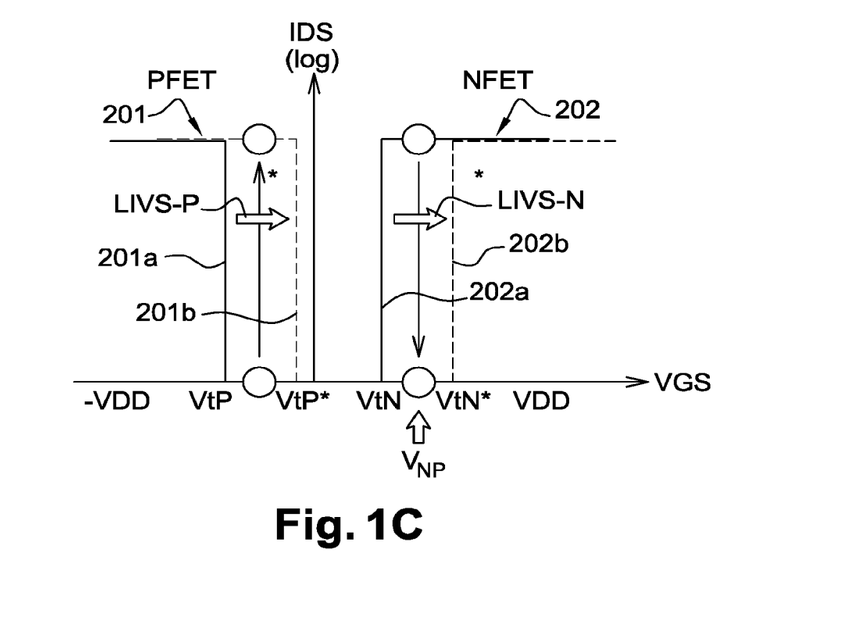
FIGS. 1C-1D show electrical operating characteristics of the inverter in FIG. 1B.

In FIG. 1C, curves 201, 202 of respective variation of the drain-source currents of the first transistor $T_1$ and of the second transistor $T_2$ as a function of their respective gate-source voltages are given. This figure shows the shifts in the threshold voltages $LIVS_P$ of the first transistor $T_1$ and $LIVS_N$ of the second transistor $T_2$ generated by the reception of a given quantity of photons or by a given increase in the quantity of photons received by the photosensitive zone 15 arranged opposite the transistors $T_1$, $T_2$.

The threshold voltage of the first transistor $T_1$ can pass from a value Vtp when the photosensitive zone is not illuminated or insufficiently illuminated (portion 201a of the curve 201 in a continuous line) to a value Vtp* when the photosensitive zone is illuminated or sufficiently illuminated (portion 201b of the curve 201 as a broken line), where |Vtp*−Vtp| which may be for example of the order of 100 mV. For an equal quantity of photons received by the photosensitive zone, this difference in threshold voltage |Vtp*−Vtp| can be increased by decreasing the thickness of the insulating layer 11 of the smallest substrate, and/or by increasing the chosen thickness of the surface semiconductor layer, and/or by increasing the chosen thickness of gate dielectric of the first transistor $T_1$.

Likewise the threshold value of the second transistor $T_2$ can pass from a value Vtn when the photosensitive zone is not illuminated or insufficiently illuminated (portion 202a of the curve 202 in a continuous line) to a value Vtn* when the photosensitive zone is illuminated or sufficiently illuminated (portion 202b of the curve 202 as a broken line), where Vtn*−Vtn which may be for example of the order of 100 mV.

In this configuration example, the arrangement of the P and N doped zones of the junctions $19_1$, $19_2$ is such that a change in the illumination of the photosensitive zone 15 causes a shift in the respective threshold voltages Vtn and Vtp of the transistors in the same direction of variation (VtN increasing and VtP decreasing in absolute value). Thus an increase in the quantity of photons received by the photosensitive zone 15 of the logic inverter is here able to induce a decrease (in absolute value) of the threshold voltage of the first transistor $T_1$ (of type P) and an increase in the threshold voltage of the second transistor $T_2$ (of type N).

Figure 2A:
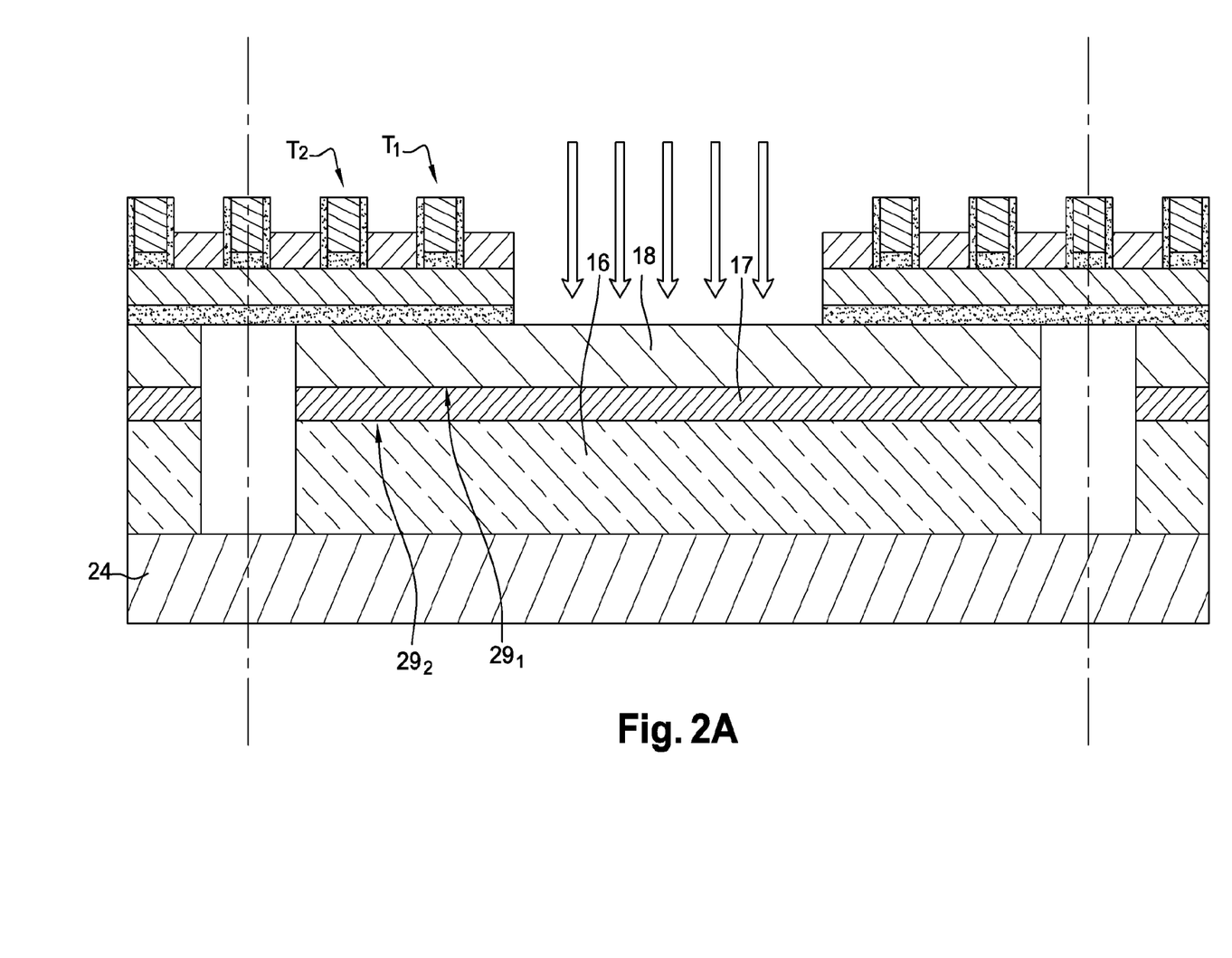
FIGS. 2A-2B show a second configuration example of a photosensitive logic inverter.
Figure 2B:
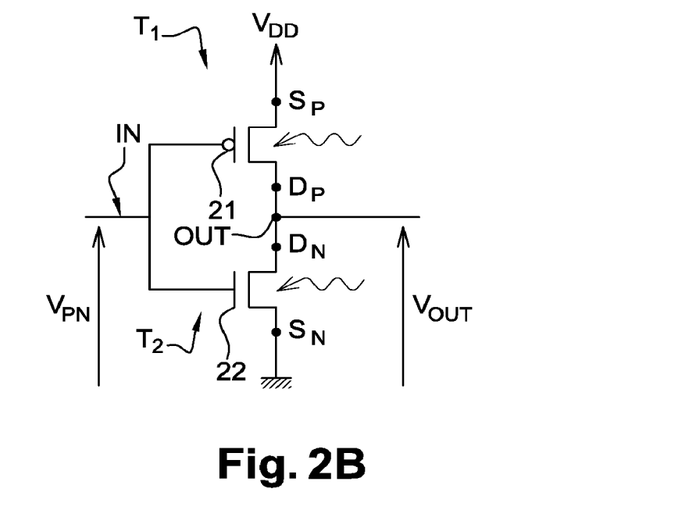
Figure 2C:
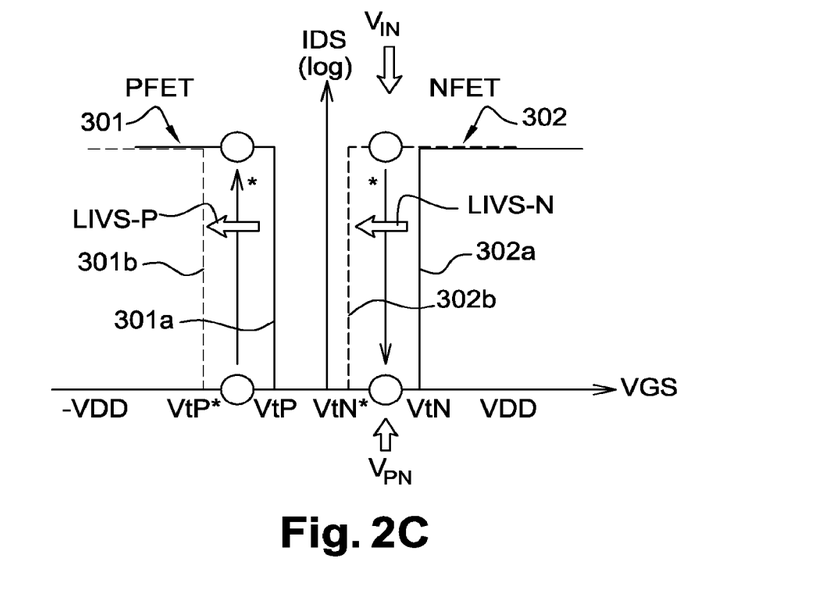
FIGS. 2C-2D show electrical operating characteristics of the second inverter example.
Figure 2D:
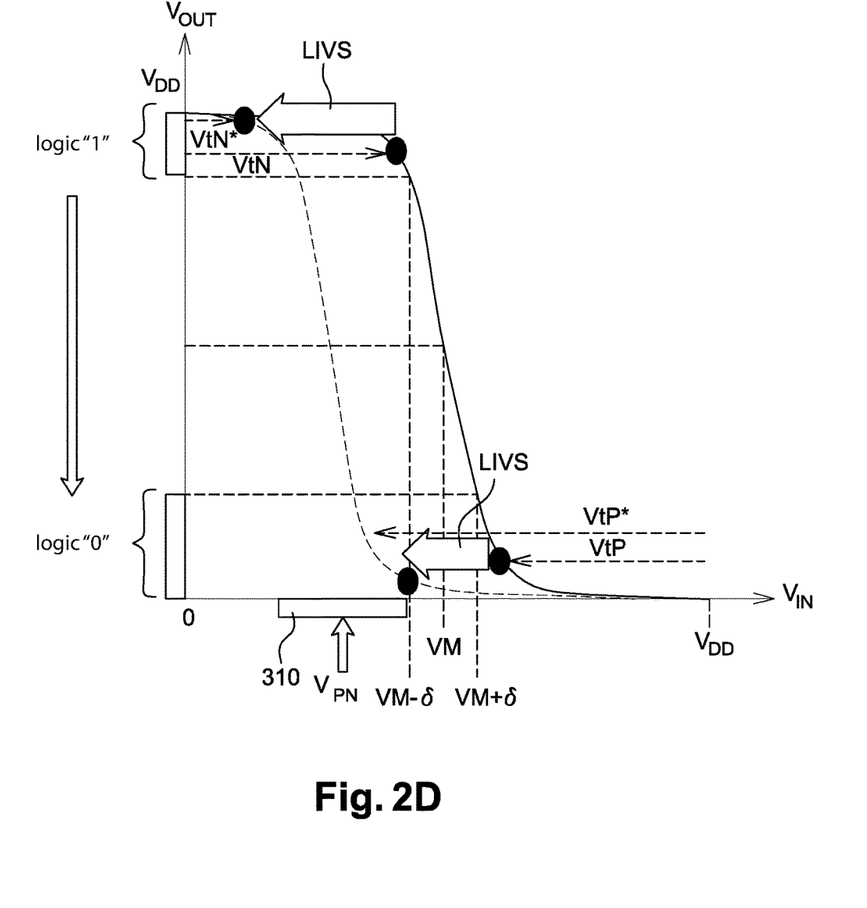

FIG. 2D shows a transfer function of the output signal $V_{OUT}$ as a function of the signal applied as an input of the first logic inverter example when the latter is not subjected to light radiation (portion of curve 211a) and when the latter is subjected to light radiation (portion of curve 211b).

When the fixed biasing potential $V_{NP}$ applied to the terminal IN is chosen from a suitable voltage range (indicated by a portion 210 on the axis of the abscissa) and when the photosensitive zone of the inverter passes from a first state of illumination (for example a non-illuminated or insufficiently illuminated state) to a second more substantially illuminated state, the signal $V_{OUT}$ at the output of the inverter can pass from a level $V_{OUT}=0V$ representative for example of a logic 0 at the output from the inverter, to a level $V_{OUT}=V_{DD}$ representative for example of a logic 1 at the output of the inverter.

The operation is reversible in such a way that when the fixed biasing potential $V_{NP}$ of the terminal IN is located in the appropriate voltage range, the signal $V_{OUT}$ at the output of the inverter can change from a level $V_{OUT}=V_{DD}$ representative for example of a logic 1, to a level $V_{OUT}=0V$ representative for example of a logic 0 consecutive to the change of the photosensitive zone on the inverter from a second state of illumination (illuminated or sufficiently illuminated) to the first state of illumination (non-illuminated or insufficiently illuminated).

The biasing potential $V_{NP}$ is in this example chosen in such a manner as to be greater than a potential $V_M$ which corresponds to the potential for which the potential $V_{OUT}$ at the output OUT of the inverter is equal to the potential $V_{IN}$ applied to the IN terminal. The potential $V_M$ is defined as the point in the inverter transfer curve for which $V_{IN}=V_{OUT}$ (and which corresponds to an intersection between the transfer curve 211 with a bisector B of an angle formed by the axes of a reference whereon the curve 211 is represented).

The biasing potential $V_{NP}$ is preferably chosen such that $V_{NP}$ is greater than $V_M+\delta$ where $\delta$ is a voltage dependant on the noise margin and which is a function of the voltage $V_{DD}$.

The biasing potential $V_{IN}=V_{NP}$ applied to the terminal IN is advantageously chosen such that:

$$V_M + \delta < V_{NP} < V_M + \delta + \frac{LIVS_N + |LIVS_P|}{2}$$

So, $$V_M = \frac{V_{DD} - |Vt_P| + Vt_N\sqrt{\frac{\beta_N}{\beta_P}}}{1 + \sqrt{\frac{\beta_N}{\beta_P}}}$$

where:

$$\beta_N = \mu_N * Cox_N * \left(\frac{W}{L}\right)_N$$

$$\beta_P = \mu_P * Cox_P * \left(\frac{W}{L}\right)_P$$

Whilst a conventional converter flip-flops at a voltage $V_M$, in this case it may be considered that:
the logic output level is at a logic level 1 when VIN<VM−δ,
the logic output level is at a logic level 0 when VIN>VM+δ, We shall define:

$$|Vt^*_P| = |Vt_P| + LIVS_P$$

where:
$LIVS_P<0$ for a BOX/N/P arrangement of the N- and P-doped zones of the junctions, that is, as in FIG. 2A and $$Vt^*_N = Vt_N + LIVS_N$$

where:
$LIVS_N>0$ for a BOX/N/P arrangement of the N- and P-doped zones of the second junction as in FIG. 1A.

The biasing potential of the input IN may be chosen for example such that $V_{NP} \in [VM; VM+200\ mV]$ $V_M$ is dependent on $Vt_N$, $Vt_P$, and on $V_{DD}$.

If a first level of illumination is applied to the photosensitive logic inverter, the N type transistor $T_2$ is pass-through and the P type transistor $T_1$ is blocked.

The output is thus placed at the potential Vss or ground potential, that is, in the low state. Conversely, when a second illumination level is applied to the photosensitive logic inverter, the P type transistor $T_1$ is pass-through and the N type transistor $T_2$ is blocked. The output is therefore at the potential $V_{DD}$ which expresses a high state. An inversion function or a logic NOT has thus been performed.

The photonic logic inverter whose output depends on the illumination that it receives may thus follow the following truth table:

| IN | Light | OUT |
|---|---|---|
| $V_{NP}$ | NO | 0 |
| $V_{NP}$ | YES | 1 |

A second configuration example of a cell forming a photosensitive logic inverter is given in FIG. 2A-2B.

The second example of an inverter differs from that described earlier in particular due to the arrangement of the photosensitive zone 15 which is, for this alternative, formed of a zone 16 doped according to a N type doping whereon a zone 18 doped according to a P type doping is arranged. The P doped zone 18 is in this example located beneath the insulating layer 12 of BOX and arranged between the N doped zone 16 and the surface layer 12. Thus a first PN type junction $29_1$ is placed opposite the first transistor whilst a second PN type junction $29_2$ is located opposite the second transistor $T_2$.

In the specific example of FIG. 2A, an additional N+ doped zone 24 is provided in contact with the N doped zone of the photosensitive zone in the support layer 10, in order to allow the junctions to be biased.

Alternatively the junctions $29_1$, $29_2$ may also be created in an overall N doped support layer.

As regards the layout of the transistors (FIG. 2B) and the biasing of their respective source electrodes $S_P$ and $S_N$, the configuration of the second inverter example is similar to that of the first inverter example described earlier.

The terminal IN connected to the respective gates 21 and 22 of the first transistor $T_1$ and of the second transistor $T_2$, is this time set at an appropriate fixed biasing potential $V_{PN}$. The transistors $T_1$ and $T_2$ are thus biased in such a manner as to have a constant gate-source voltage $V_{GS}$, where a respective change of pass-through or blocked state of the transistors may be achieved by varying their respective threshold voltages $V_{TP}$ and $V_{TN}$, this variation itself being dependent on the illumination state of the photo-sensitive zone.

FIG. 2C shows respective drain-source current variation curves 301, 302 of the first transistor $T_1$ and of the second transistor $T_2$ as a function of their respective gate-source voltages. It shows the respective voltage shifts $LIVS_P$ and $LIVS_N$ (shown respectively by a shift between the portion of curve 301a and the portion of curve 301b for the P type transistor and by a shift between the portion of the curve 302a and the portion of the curve 302b for the N type transistor) of the first transistor and of the second transistor caused by illumination of, or an increase in the illumination of, the photosensitive zone.

The threshold voltage of the first transistor $T_1$ (P type) increases as an absolute value, whereas the threshold voltage of the second transistor $T_2$ (N type) decreases as an absolute value. The threshold voltage shift Vt occurs here in the same direction (negative).

In this example, in order for the inverter output to be able to flip-flop from one logic state to another as a function of the illumination state of the photosensitive zone, the input IN of the inverter is biased at a fixed potential $V_{PN}$ chosen from an appropriate voltage range (portion 310 on the abscissa axis of FIG. 2D). The biasing potential $V_{PN}$ is chosen in this example in such a manner as to be less than the potential $V_M$ and preferably such that $V_{PN}$ is less than $V_M-\delta$ where $\delta$ is a voltage which is dependent on the noise margin.

The biasing potential $V_{PN}$ applied at the terminal IN is advantageously chosen such that:

For a BOX/P/N arrangement of the doped zones of the junctions as shown in FIG. 2A, $V_{PN}$ is defined by:

$$V_M - \delta - \frac{LIVS_P + |LIVS_N|}{2} < V_{PN} < V_M - \delta$$

where $LIVS_P > 0$ and $LIVSN < 0$.

When the biasing potential $V_{PN}$ of the input IN is chosen from the suitable voltage range and when the photosensitive zone of the inverter is in a first non-illuminated or insufficiently illuminated state, the signal $V_{OUT}$ at the output of the inverter is at a level $V_{OUT}=V_{DD}$ representative for example of a logic '1' at the inverter output. When the biasing potential $V_{PN}$ of the input IN is chosen from the suitable voltage range and when the photosensitive zone of the inverter is in a second illuminated or sufficiently illuminated state, the signal $V_{OUT}$ at the output of the inverter is at a level $V_{OUT}=0V$ representative for example of a logic '0' at the inverter output.

The second photonic logic inverter example may thus follow the following truth table:

| IN | Light | OUT |
|---|---|---|
| $V_{PN}$ | NO | 1 |
| $V_{PN}$ | YES | 0 |

Using photosensitive cells as described above, a logic circuit can be implemented which can be controlled by light and whose functions, in particular logic functions, can be modified according to the level of illumination that the logic circuit receives.

Figure 1D:
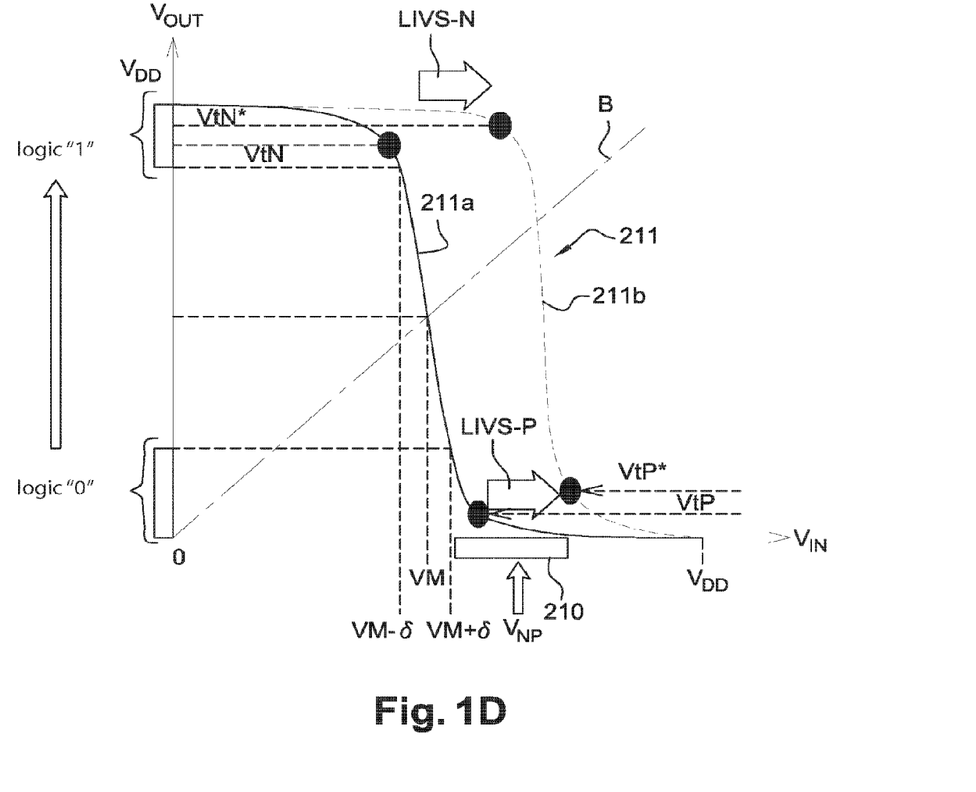

FIGS. 1D and 2D show that, within a certain voltage range applied to the input IN of a photosensitive logic inverter, the logic output OUT of the inverter can be flip-flopped by a variation in illumination and a sufficient addition of photons, where the logic state of this OUT output does not flip-flop when the addition of photons is insufficient.

The function that can be modified by illumination may be for example a collective programming function of cells or a zero reset. Such a logic circuit may be implemented for example in such a way that a short light pulse or flash of light allows a set of photosensitive logic inverters to be flip-flopped. A logic circuit which is controlled, or programmed or reset to zero, without the need for specific addressing by means of a flash of light applied, for example, to the rear face of a chip on which this circuit is mounted, may thus be created.

An alternative arrangement of one or other of the photosensitive logic cell examples described earlier is shown in in FIG. 3.

Figure 3:
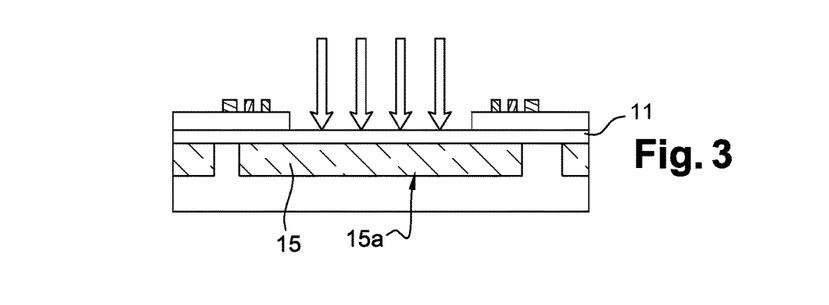
FIG. 3 shows an advantageous embodiment alternative for which the surface semiconductor layer of the substrate is removed opposite the photo-detection region, whilst the insulating layer of the substrate is retained.

The insulating layer 11 of the semiconductor-on-insulator substrate is this time retained opposite the photo-detection region 15a.

With such a configuration surface recombination effects are limited. The insulating layer 11 may also fulfil an anti-reflection layer role. As in the examples described above, the photo-detection region 15a is not covered by the surface layer 12 of the substrate.

In FIGS. 4A-4D various examples of gate electrode arrangements of transistors $T_1$, $T_2$ of a photosensitive logic cell as previously described are given.

For all these examples the cell $C_1$ is demarcated at the periphery by the gate 30 which serves to electrically insulate the cell $C_1$. The additional gate 30 makes a continuous closed outline around transistors $T_1$, $T_2$ and around the photo-detection region 15a.

Figure 4A:
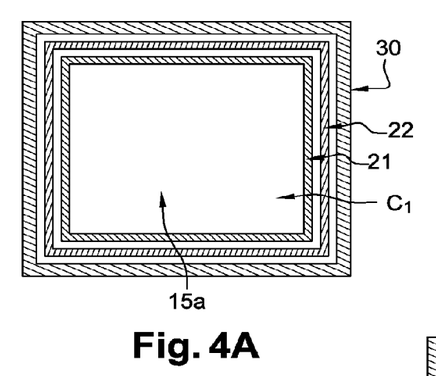
FIGS. 4A-4D show different alternative arrangements of the photosensitive cell transistor gate electrodes.
Figure 4B:
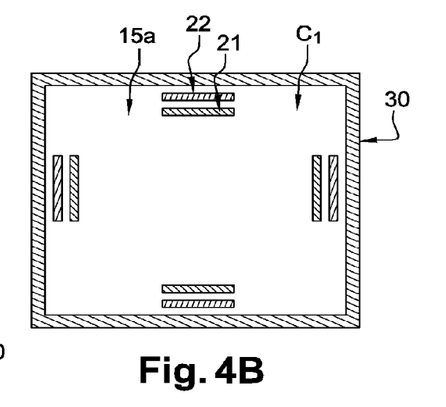
Figure 4C:
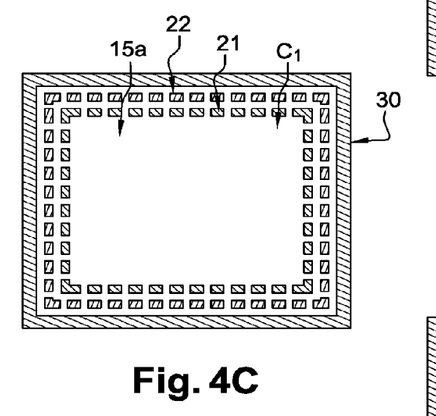

In the examples in FIGS. 4A-4C, the gates 21, 22 of the transistors $T_1$, $T_2$ are surrounded by the additional gate 30 and are also arranged at the periphery of the cell $C_1$ and around the photo-detection region 15a.

The choice between these configurations will depend on the compromise between static power consumption/sensitivity.

The arrangement example in FIG. 4A allows improved sensitivity to be achieved in comparison to that of FIG. 4C, but the FIG. 4C configuration is more advantageous in terms of power consumption.

Figure 4D:
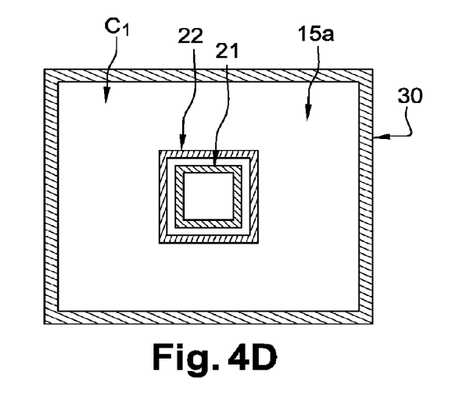

Alternatively, as in the embodiment example in FIG. 4D, the gates 21, 22 of the transistors $T_1$, $T_2$ can be arranged at the centre of the cell $C_1$ in order to further reduce the power consumption. In this case the photo-detection region 15a is located around the gates 21, 22 of transistors $T_1$, $T_2$ between these gates 21, 22 and the additional electrode 30.

The gates 21, 22 may form a closed continuous outline as in FIG. 4A or take the form of discontinuous blocks as in the embodiment examples in FIG. 4B-4C.

In one or other of the photosensitive logic cell examples described earlier, when the photosensitive zone 15 is illuminated, the charge carriers can accumulate in the regions located beneath the insulating BOX layer 11 at the interface, respectively, of the two PN type junctions $29_1$, $29_2$ or NP type junctions $19_1$, $19_2$. The discharge time for these regions may prove to be insufficiently short between two read cycles for the cell.

One way of allowing a fast discharge of the BOX/junction interface to occur is to incorporate a so-called "discharge" transistor in the photosensitive logic cell.

The gate of this resistor is controlled by a signal $S_{INIT}$ whose state changes according to the "illumination", "reading" or "erase" operating state of the cell.

Figure 5A:
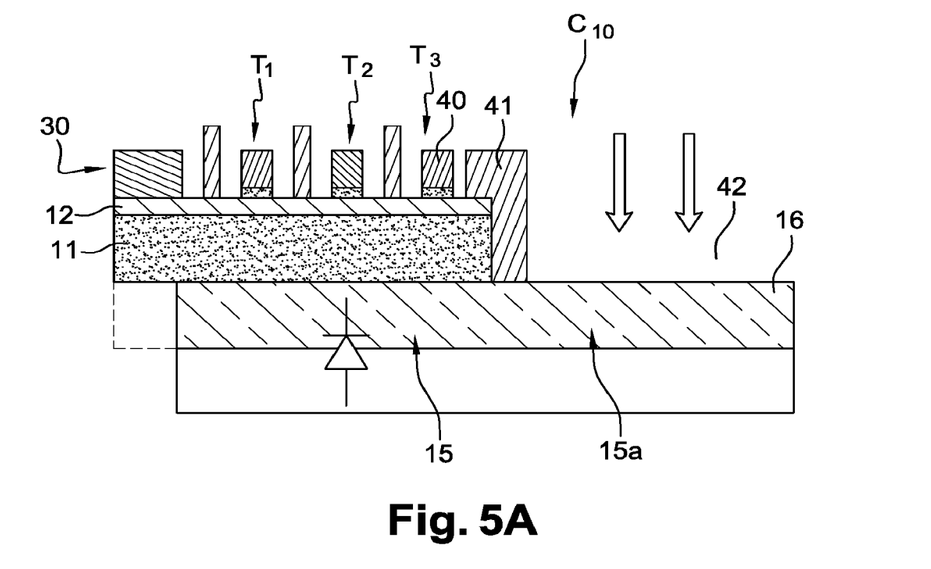
FIGS. 5A-5B show a first example of a photosensitive logic cell equipped with a charge evacuation transistor.
Figure 5B:
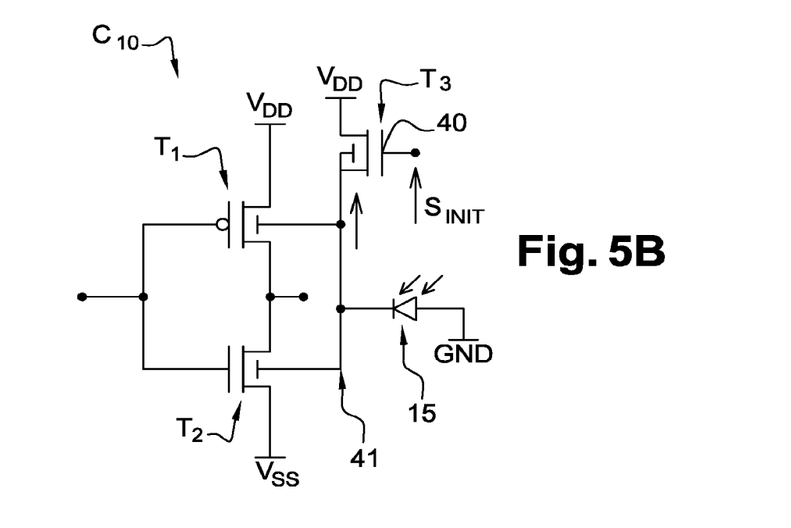

FIGS. 5A-5B show an example of a cell $C_{10}$ equipped with such a discharge transducer $T_3$, here N type. The configuration of the photosensitive zone 15 of the cell $C_{10}$ may be similar to that of cell $C_1$ described earlier in association with FIG. 1A, that is with an N doped zone 16 arranged on a P doped zone, the N doped zone 16 therefore being intercalated between the P doped zone and the insulating BOX layer 11.

The discharge transistor $T_3$ in this example has a drain electrode connected to the source of the first transistor $T_1$ or which is set at the same potential as the source of the first transistor $T_1$. The discharge transistor $T_3$ also has a source electrode connected to the photosensitive zone 15.

This connection between the discharge transistor $T_3$ and the photosensitive zone 15 may be made as in FIG. 5A by means of a conductive element 41 which comprises one end in contact with the surface semiconductor layer 12 and another end in contact with the N doped zone 16 of the photo-detection region 15a. In particular the conductive element 41 connects the photo-detection region 15a and the surface layer 12 and here passes through an opening 42 made in the insulating layer 11 and the surface layer 12 of the substrate opposite the photo-detection region 15a.

In FIG. 5B, in order to show the effect of electrostatic coupling between the photosensitive zone 15 and the transistors $T_1$, $T_2$, $T_3$ the latter are shown with a second gate, with the photosensitive zone 15 in turn being represented as a photo-diode. In this embodiment example, the source of the first transistor $T_1$ and the drain of the discharge transistor $T_3$, may be connected or biased at the same potential $V_{DD}$ The source of the second transistor $T_2$ is placed at a potential Vss which depends on the operating phase in which it is desired to place the cell, and differs according to whether a reading of the logic state of the cell is carried out or whether the cell is in illumination or an erasure phase.

Similarly the gate of the discharge transistor $T_3$ is set at a potential $S_{INIT}$ whose value varies as a function of the operating phase in which the cell is placed.

The following table summarises the various states of the signals Vss and $S_{INIT}$ during the various operational phases of the cell.

An illumination phase during which the cell $C_{10}$ is subjected to light radiation that can modify its output state OUT can be distinguished, a cell state reading phase and an erasure phase during which the cell output OUT of the cell can be reset to an initial state, that is, to before a change of state caused by a change of illumination.

| Phase | Vss | $S_{INIT}$ |
|---|---|---|
| Illumination | VDD | GND |
| Reading | GND | GND |
| Erasure | VDD | VDD |

In this example, erasure of the cell and the removal of electrons located at the interface between the insulating later and the support layer are allowed, by modifying the discharge transistor gate potential.

Thus when the cell is in a reading or illumination phase the transistor gate is set at a first potential $S_{INIT}$=GND in such a way as to block the discharge transistor, then when it is desired to erase the logic state at the output from the cell the discharge transistor $T_3$ gate is set at a second potential $S_{INIT}$=VDD so as to make the discharge transistor pass-through.

Thus when the cell is in a reading or illumination phase the transistor gate is set at a first potential $S_{INIT}$=GND in such a way as to block the discharge transistor $T_3$, then when it is desired to erase the logic state at the output from the cell the discharge transistor $T_3$ gate is set at a second potential $S_{INIT}$=VDD so as to make the discharge transistor pass-through.

Figure 6A:
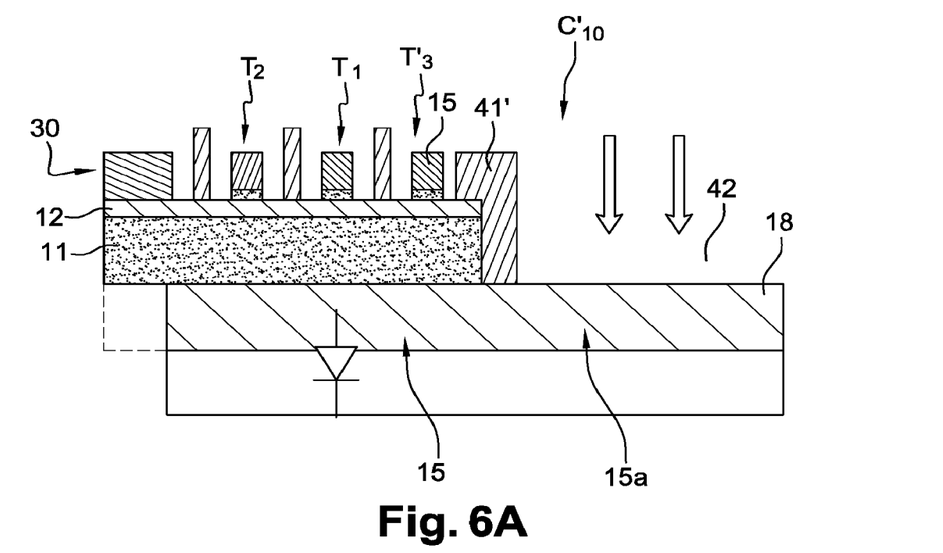
FIGS. 6A-6B show a second example of a photosensitive logic cell equipped with a charge evacuation transistor.
Figure 6B:
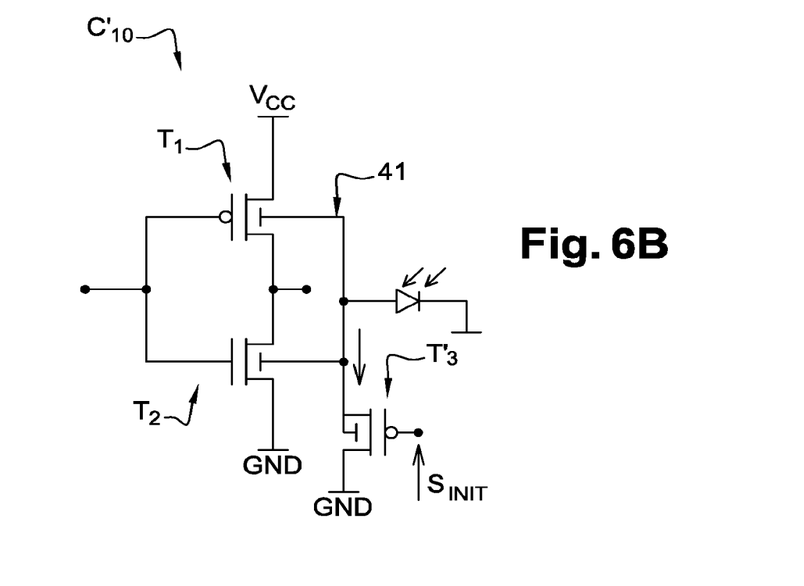

An alternative embodiment is shown in FIGS. 6A-6B with a cell $C_{10}$ this time equipped with such a P type discharge transistor $T'_3$. The photosensitive zone 15 of the cell $C'_{10}$ may be similar to that of cell $C_1$ described earlier in association with FIG. 2A, that is with a P doped zone 18 arranged on an N doped zone, the P doped zone 18 therefore being intercalated between the N doped zone and the insulating BOX layer 11. The discharge transistor $T'_3$ in this example has a drain electrode in common with the first transistor $T_1$ and a source electrode connected to the photosensitive zone 15. This connection may be made as in FIG. 6A by means of a conductive element 41' which extends against an edge of the surface layer 12 and connects this layer to the P doped zone 18 of the photo-detection region 15a.

In this embodiment example, the source of the second transistor $T_2$ and the drain of the discharge transistor $T'_3$ may be connected and/or biased at the same potential GND. The source of the first transistor $T_1$ is set at a potential Vcc which varies according to the operating phase that the cell $C'_{10}$ is in. A signal $S_{INIT}$, the value of which also varies according to which operating phase the cell is in, is applied to the gate of the discharge transistor $T_3$.

The following table summarises the various states of the signals Vss and $S_{INIT}$ during the various operational phases of the cell $C'_{10}$.

| Phase | Vcc | $S_{INIT}$ |
|---|---|---|
| Illumination | GND | VDD |
| Reading | VDD | VDD |
| Erasure | GND | GND |

An erasure of the cell is thus carried out by modifying the potential of the discharge transistor gate.

The invention claimed is:

1. A device comprising at least one photosensitive logic cell, the cell comprising:
a first P type transistor and a second N type transistor, the first and second transistors resting on a semiconductor-on-insulator substrate, with the substrate comprising a surface semiconductor layer comprising a channel zone of the first transistor and a channel zone of said second transistor, with an insulating layer separating the surface semiconductor layer from a semiconductor support layer, the support layer comprising at least one photosensitive zone configured to convert photons into charge carriers, with the insulating layer being configured so as to allow electrostatic coupling between the photosensitive zone and the surface semiconductor layer, in such a way that the first transistor and the second transistor have a first threshold voltage and a second threshold voltage respectively that are modulated according to a quantity of photons received by the photosensitive zone, with the photosensitive zone being formed of a N doped zone and a superimposed P doped zone forming a first junction arranged opposite the channel zone of said first transistor and a second junction opposite the channel zone of said second transistor, with the photosensitive zone furthermore comprising a photo-detection region through which a luminous flux enters, the surface semiconductor layer of the substrate comprising an opening such that the surface semiconductor layer does not extend opposite the photo-detection region.

2. The device according to claim 1 wherein the first transistor and the second transistor respectively comprise a first gate and a second gate arranged on the surface semiconductor layer, the cell comprising an additional gate electrode arranged at a periphery of the cell around a region of the cell where the first gate and the second gate are arranged.

3. The device according to claim 2, wherein the additional gate electrode forms a closed outline around the first gate and the second gate.

4. The device according to claim 2, comprising another cell juxtaposed with said cell, where the surface semiconductor layer is continuous between the cell and the another cell, with no insulating zone between said cell and said other cell within the surface semiconductor layer.

5. The device according to claim 2, wherein the first gate and the second gate are arranged opposite another region of the photosensitive zone located at a periphery of the photo-detection region.

6. The device according to claim 1, wherein the insulating layer of the substrate extends opposite the photo-detection region.

7. The device according to claim 1, the cell furthermore comprising a charge evacuation transistor connected to the photosensitive zone.

8. The device according to claim 7, the charge evacuation transistor and the photosensitive zone being connected by at least one connection element in contact with the photo-detection region and which passes into said opening.

9. The device according to claim 7, further comprising a biasing control circuit configured to apply a signal to the charge evacuation transistor, the signal having a variable state and applied in such a way as to block the charge evacuation transistor when a reading of a logic state at output of the cell is carried out, and in such a way as to render the charge evacuation transistor pass-through when an erasure of the logic state at the output of the cell is performed.

10. The device according to claim 1, wherein the first transistor and the second transistor are of Fully Depleted Silicon on Insulator (FDSOI) type.

* * * * *